United States Patent
Riordon et al.

(10) Patent No.: US 9,000,446 B2
(45) Date of Patent: Apr. 7, 2015

(54) TECHNIQUES FOR PROCESSING A SUBSTRATE

(75) Inventors: Benjamin B. Riordon, Newburyport, MA (US); Kevin M. Daniels, Lynnfield, MA (US); William T. Weaver, Austin, TX (US); Steven M. Anella, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 468 days.

(21) Appl. No.: 12/783,873

(22) Filed: May 20, 2010

(65) Prior Publication Data

US 2010/0297782 A1 Nov. 25, 2010

Related U.S. Application Data

(60) Provisional application No. 61/180,614, filed on May 22, 2009.

(51) Int. Cl.
| | |
|---|---|
| *H01L 29/15* | (2006.01) |
| *H01L 21/66* | (2006.01) |
| *H01J 37/317* | (2006.01) |
| *H01J 37/20* | (2006.01) |
| *H01J 37/304* | (2006.01) |
| *H01L 31/0224* | (2006.01) |
| *H01L 31/0288* | (2006.01) |
| *H01L 31/068* | (2012.01) |
| *H01L 31/18* | (2006.01) |

(52) U.S. Cl.
CPC ............ *H01J 37/3171* (2013.01); *H01J 37/20* (2013.01); *H01J 37/3045* (2013.01); *H01L 31/022425* (2013.01); *H01L 31/0288* (2013.01); *H01L 31/068* (2013.01); *H01L 31/0682* (2013.01); *H01L 31/1804* (2013.01); *H01J 2237/20235* (2013.01); *H01J 2237/31711* (2013.01); *Y02E 10/547* (2013.01)

(58) Field of Classification Search
USPC .......................................................... 257/77
See application file for complete search history.

(56) References Cited

U.S. PATENT DOCUMENTS

| | | | |
|---|---|---|---|
| 4,310,743 | A | 1/1982 | Seliger |
| 4,494,005 | A | 1/1985 | Shibata et al. |
| 4,823,011 | A | 4/1989 | Stengle et al. |
| 2002/0026878 | A1 * | 3/2002 | Kwan et al. ................ 101/463.1 |
| 2006/0289798 | A1 | 12/2006 | Cummings et al. |

OTHER PUBLICATIONS

International Search Report and Written Opinion Mailed Jul. 23, 2010 for PCT/US2010/035799 Filed May 21, 2010.

* cited by examiner

*Primary Examiner* — Matthew Landau
*Assistant Examiner* — Igwe U Anya

(57) ABSTRACT

Herein, an improved technique for processing a substrate is disclosed. In one particular exemplary embodiment, the technique may be realized with a system for processing one or more substrates. The system may comprise an ion source for generating ions of desired species, the ions generated from the ion source being directed toward the one or more substrates along an ion beam path; a substrate support for supporting the one or more substrates; a mask disposed between the ion source and the substrate support, the mask comprising a finger defining one or more apertures through which a portion of the ions traveling along the ion beam path pass; and a first detector for detecting ions, the first detector being fixedly positioned relative to the one or more substrates.

11 Claims, 7 Drawing Sheets

TECHNIQUES FOR PROCESSING A SUBSTRATE

PRIORITY

This application claims priority to U.S. Provisional Patent Application Ser. No. 61/180,614, filed on May 22, 2009, entitled "In-situ Alignment System For Implantation Through A Mask." The entire specification of U.S. Provisional Patent Application Ser. No. 61/180,614 is incorporated herein by reference.

FIELD

This invention relates to techniques for processing a substrate, more particularly to techniques for processing a substrate with proper alignment.

BACKGROUND

In manufacturing electronic devices, dopants or impurities are introduced into a substrate to alter one or more of the underlying substrate's property. In manufacturing memory devices, boron ions may be introduced into a silicon substrate. As boron ions and silicon atoms in the crystal lattice have different electrical property, introduction of sufficient amount of boron ions may alter the electrical property of the silicon substrate.

A solar cell, another silicon substrate based device, may also be manufactured by introducing ions or dopants into the silicon substrate. Referring to FIG. 1, there is shown a cross-sectional view of a conventional selective emitter solar cell 100. The selective emitter solar cell 100 may comprise a p-type base 112. Adjacent to the p-type base 112, there may be a lightly doped n-type emitter 114. The selective emitter solar cell 100 may also comprise a plurality of heavily doped n-type contacts 122. Further, the selective emitter solar cell 100 may comprise a plurality of front side contacts 124 and a backside contact 126. To minimize light incident on the selective emitter solar cell from reflecting away from the selective emitter solar cell 100, an anti-reflective coating 132 may be disposed on the front side of the selective emitter solar cell 100.

Referring to FIG. 2, there is a cross-sectional view of a conventional interdigitated back contact (IBC) solar cell 200. IBC solar cell 200 may comprise an n-type base 212, on which an n-type front surface field 222, $SiO_2$ passivating layer 224, and anti-reflective coating 226 may be disposed. As illustrated in the figure, the front side of the IBC solar cell 200 may have random pyramid configuration to additionally prevent light being reflected from IBC solar cell 200. On the back side, there may be p-type diffused emitter 232, n-type back surface field 234, a back side passivating layer 236, and a plurality of p-type contact fingers 242 and n-type contact fingers 244 alternately disposed. As illustrated in the figure, each p-type contact fingers 242 is in contact with p-type diffused emitter 232 via contact holes 250 through the backside passivating layer 232. Meanwhile, each n-type contact fingers 244 is in contact with n-type back surface field 234 via the contact holes 250 through the backside passivating layer 232.

The lightly doped n-type emitter 114 and heavily doped contacts 122 in the elective emitter solar cell 100, and p-type diffused emitter 232 and n-type backside surface field 234 in IBC solar cell 200 may be formed by providing dopants into the bases 112 and 222 of each solar cell 100 and 200. In the past, dopants have been introduced via diffusion process. In the diffusion process, dopant containing glass or paste is disposed on the silicon substrate. Thereafter, the substrate is heated, and the dopants in the glass or past are diffused into the substrate via thermal diffusion.

Although the diffusion process may be cost effective, the process has many drawbacks. For example, it is desirable to perform selective doping to introduce dopants to only selected regions of the substrate. However, the diffusion process is difficult to control, and precise doping via diffusion may be difficult to achieve. Precise doping may be desirable in forming for both elective emitter or IBC solar cells 100 and 200 as imprecise doping may lead to, among others, recombination of dopants or non-uniformity. In addition, voids or air bubbles, or other contaminants may be introduced into the substrate along with the dopants during the diffusion process.

To address such drawbacks, doping via ion implantation process has been proposed. In the proposed process, the substrate is coated with photo-resist layer, and lithographic process is performed to expose portions of the substrate. Thereafter, the ion implantation is performed, and dopants are implanted into the exposed portions. The process, although achieves precise selective doping, is not inexpensive. Additional steps and time to coat, pattern, and remove the photo-resist, each of which adds costs to the manufacturing process, are required. The steps may be more complicated if the regions to be exposed are extremely small. Another process that was proposed is a process of ion implantation using hard mask. This process also is a costly process requiring additional process steps.

Any added cost in manufacturing the solar cell would decrease the solar cell's ability to generate low cost energy. Meanwhile, any reduced cost in manufacturing high-performance solar cells with high efficiency would have a positive impact on the implementation of solar cells worldwide. This will enable the wider availability and adoption of clean energy technology.

As such, a new technique is needed.

SUMMARY OF THE DISCLOSURE

An improved technique for processing a substrate is disclosed. In one particular exemplary embodiment, the technique may be realized with a system for processing one or more substrates. The system may comprise an ion source for generating ions of desired species, the ions generated from the ion source being directed toward the one or more substrates along an ion beam path; a substrate support for supporting the one or more substrates; a mask disposed between the ion source and the substrate support, the mask comprising a finger defining one or more apertures through which a portion of the ions traveling along the ion beam path pass; and a first detector for detecting ions, the first detector being fixedly positioned relative to the one or more substrates.

In accordance with other aspects of this particular exemplary embodiment, the first detector may be disposed on the substrate support.

In accordance with additional aspects of this particular exemplary embodiment, the system may further comprise a second detector for detecting ions, the second detector being fixedly positioned relative to the one or more substrates.

In accordance with further aspects of this particular exemplary embodiment, the second detector may be disposed on the substrate support.

In accordance with other aspects of this particular exemplary embodiment, the first detector may be positioned behind the finger and removed from a direct line-of-sight of the ions if the mask and the one or more substrates are properly aligned.

In accordance with additional aspects of this particular exemplary embodiment, the system may further comprise a second detector for detecting ions, where the second detector may be fixedly positioned relative to the one or more substrates, and where the second detector may be positioned behind the finger and in a direct line-of-sight of the ions if the mask and the one or more substrates are properly aligned.

In accordance with further aspects of this particular exemplary embodiment, the system may further comprise a second detector for detecting ions, where the second detector may be fixedly positioned relative to the one or more substrates, and where the second detector may be positioned behind the finger and removed from a direct line-of-sight of the ions if the mask and the one or more substrates are properly aligned.

In accordance with additional aspects of this particular exemplary embodiment, the system may further comprise a motion control system configured to adjust the position of at least one of the mask and the one or more substrates relative to one another.

In accordance with other aspects of this particular exemplary embodiment, the mask may further comprise a controller coupled to the first detector and the motion control system, where the controller may be configured to provide an instruction to the motion control system to adjust the position of the at least one of the mask and the one or more substrates relative to one another.

In accordance with additional aspects of this particular exemplary embodiment, the motion control system may be configured to adjust the position of at least one of the mask and the one or more substrates relative to one another if the first detector detects ions.

In accordance with further aspects of this particular exemplary embodiment, the motion control system may be configured to adjust the position of at least one of the mask and the one or more substrates relative to one another if amount of ions detected by the first detector changes.

In accordance with other aspects of this particular exemplary embodiment, the motion control system may be configured to adjust the position of at least one of the mask and the one or more substrates relative to one another if amount of ions detected by the first detector is different from the amount of ions detected by the second detector.

In accordance with another particular exemplary embodiment, the technique may be realized as a method for processing a substrate. The method may comprise generating ions of desired species and directing the ions toward the one or more substrates along an ion beam path; disposing a mask upstream of the one or more substrates along the ion beam path, the mask comprising a finger defining one or more apertures through which a portion of the ions traveling along the ion beam path pass; and providing a first detector for detecting ions, where the first detector may be fixedly positioned relative to the one or more substrates.

In accordance with additional aspects of this particular exemplary embodiment, the first detector and the may be aligned along the ion beam path so as to remove the first detector from a direct line-of-sight of the ions.

In accordance with additional aspects of this particular exemplary embodiment, the first detector may be positioned behind the finger and removed from a direct line-of-sight of the ions if the mask and the one or more substrates are properly aligned.

In accordance with further aspects of this particular exemplary embodiment, the method may further comprise adjusting the position of the mask relative to the one or more substrates if the first detector detects ions.

In accordance with additional aspects of this particular exemplary embodiment, the method may further comprise adjusting the position of the mask relative to the one or more substrates if the amount of ions detected by the first detector change.

In accordance with other aspects of this particular exemplary embodiment, the method may further comprise providing a second detector for detecting ions, where the second detector may be fixedly positioned relative to the one or more substrates.

In accordance with additional aspects of this particular exemplary embodiment, the second detector may be positioned behind the finger and removed from a direct line-of-sight of the ions if the mask and the one or more substrates are properly aligned.

In accordance with further aspects of this particular exemplary embodiment, the method may further comprise adjusting the position of the mask relative to the one or more substrates if the second detector detects ions.

In accordance with additional aspects of this particular exemplary embodiment, the method may further comprise adjusting the position of the mask relative to the one or more substrates if the amount of ions detected by the second detector changes.

In accordance with other aspects of this particular exemplary embodiment, the method may further comprise adjusting the position of the mask relative to the one or more substrates if amount of ions detected by the first detector is different from amount of ions detected by the second detector.

In accordance with another exemplary embodiment, the technique may be realized with an apparatus for processing one or more substrates, the apparatus may comprise an ion source for generating ions of desired species, where the ions generated from the ion source may be directed toward the one or more substrates along an ion beam path; a substrate support for supporting the one or more substrates; a mask disposed between the ion source and the substrate support, where the mask may comprise a finger defining one or more apertures through which a portion of the ions traveling along the ion beam path pass; and a first detector for detecting ions, where the first detector may be positioned behind the finger and removed from a direct line-of-sight of the ions if the mask and the one or more substrates are properly aligned.

In accordance with other aspects of this particular exemplary embodiment, the method may further comprise a motion control system configured to adjust the position of at least one of the mask and the one or more substrates relative to one another if the first detector detects ions.

BRIEF DESCRIPTION OF THE DRAWINGS

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art will recognize additional implementations, modifications, and embodiments, as well as other fields of use, which are within the scope of the present disclosure as described herein, and with respect to which the present disclosure may be of significant utility.

DESCRIPTION

Herein several embodiments of techniques for processing a substrate are introduced. For purposes of clarity and simplicity, the embodiments may focus on the technique for introducing dopants or impurities into a substrate using ion implantation system. For example, the present disclosure may focus on techniques for processing a substrate using a ribbon beam, beam-line ion implantation system. Although not discussed in detail, other types of ion implantation systems, including a scan beam ion implantation systems using a spot or focused ion beam, are not precluded. In addition, other types of substrate processing systems including, for example, plasma assisted doping (PLAD) or plasma immersion ion implantation (PIII) systems may be equally applicable.

The dopants that are introduced into the substrate may be in the form of ions, atomic or molecular ions. However, the dopants may also be introduced into the substrate in other form including gas clusters ion beam.

The substrates disclosed in the embodiments may be silicon based substrates for manufacturing solar cells. While silicon based substrate is mainly discussed, the present disclosure may be equally applicable to substrates containing other materials. For example, the substrates containing cadmium telluride (CdTe), copper indium gallium selenide (CIGS), or other materials may also be applicable. In addition, other, non-solar cell substrates may also be applicable to the present disclosure. Metallic substrates, other semiconducting substrates, and insulating substrates for manufacturing other mechanical, electronic (e.g. memory devices), or optical (e.g. light emitting diodes) devices, or other devices may be equally applicable.

Figure 1:
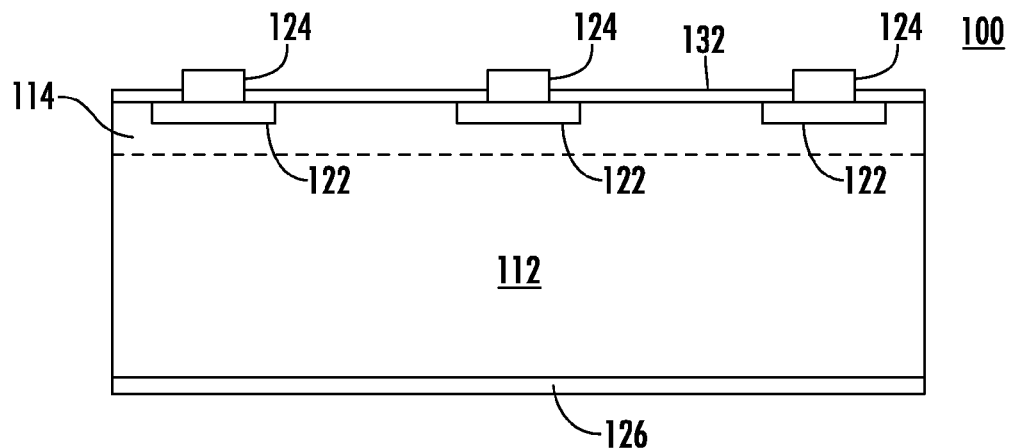
FIG. 1 illustrates a cross-sectional view of a conventional selective emitter solar cell.
Figure 2:
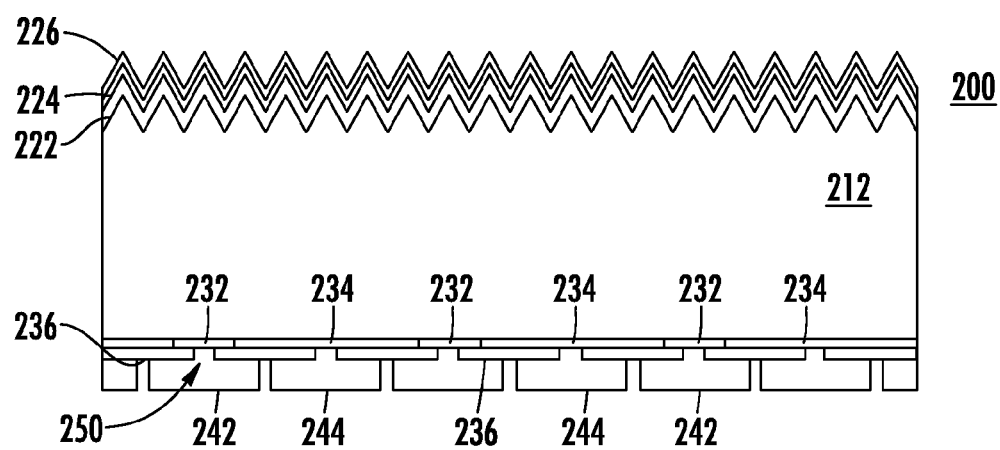
FIG. 2 illustrates a cross-sectional view of a conventional interdigitated back contact (IBC) solar cell.
Figure 3:
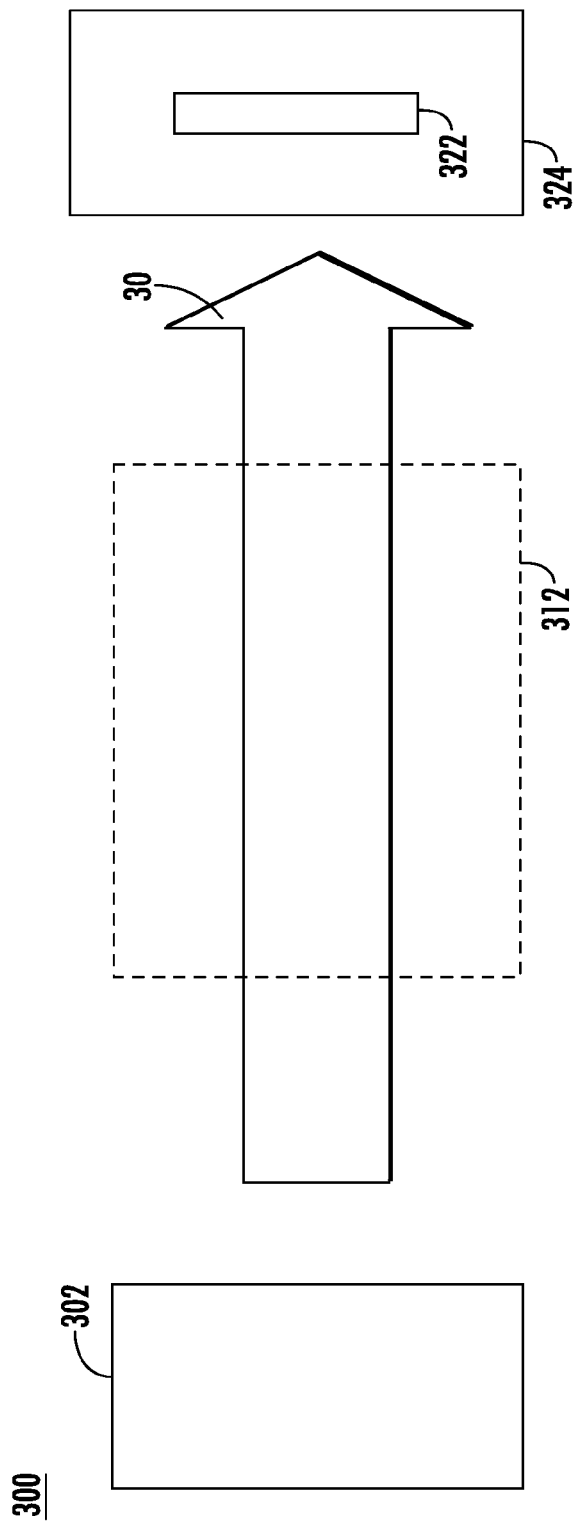
FIG. 3 illustrates a block diagram of a system for processing a substrate according to one embodiment of the present disclosure.

Referring to FIG. 3, there is shown a block diagram of an exemplary system 300 for processing a substrate according to one embodiment of the present disclosure. In the figure, an ion implantation system 300 is shown. The system 300 may include an ion source 302 for ionizing material of desired species. The ion source 302 may be connected to feed material source (not shown) containing feed material of desired species.

This feed material may contain dopant species with one or more elements from Group I and 3A-8A. For example, the feed material may contain hydrogen (H), helium (He) or other rare gases, oxygen (O), nitrogen (N), arsenic (As), boron (B), phosphorus (P), antimony (Sb), gallium (Ga), indium (In), or other elements. Alternatively, the feed material may contain carborane $C_2B_{10}H_{12}$ or another molecular compound.

After the feed material is ionized, the ions in the ion source 302 may be directed toward an optional beam-line component 312. The beam-line component may be optional as ion implantation systems in other embodiments may omit the beam-line components. If included, the optional beam-line component may be at least one of an extraction electrode (not shown), a mass analyzer (not shown), an angle corrector magnet (not shown), and first and second acceleration/deceleration stages (not shown). Much like optical lens controlling an optical beam, the beam line component 312, if included, may filter, shape, and otherwise control the ions into an ion beam 30 of desired species, mass, shape, and energy.

The ions 30 may travel along an ion beam path toward the substrate 322. The substrate 322 may be positioned in the ion beam path such that the ions from the ion beam 30 may be implanted into the substrate. Proximate to the substrate 322, upstream or downstream, there may be a plurality of process components 324 that may aid the implantation process. One of the process components 324 may include, for example, a cooling/heating station to cool/heat the substrate 322 prior to or after the ion implantation.

In some applications, selective ion implantation may be desired. For example, ions having one type of conductivity may be implanted to one or more selected regions of the substrate to form first doped regions. If multiple first doped regions are formed, the first doped regions may be spaced apart from another. In some embodiments, the region adjacent to the first doped regions may remain undoped. In other embodiments, the adjacent region may be additionally doped with same type of dopants, or dopants of opposite type to form the second doped regions. It may be desirable for the first and second doped regions to be aligned properly relative to one another. Misalignment of the regions may lead to, for example, overlapped regions implanted with both types of dopants resulting, among others, recombination of dopants or non-uniform doped regions. To aid the formation of the doped regions with proper alignment, the process components 324 may include an alignment system.

Figure 4:
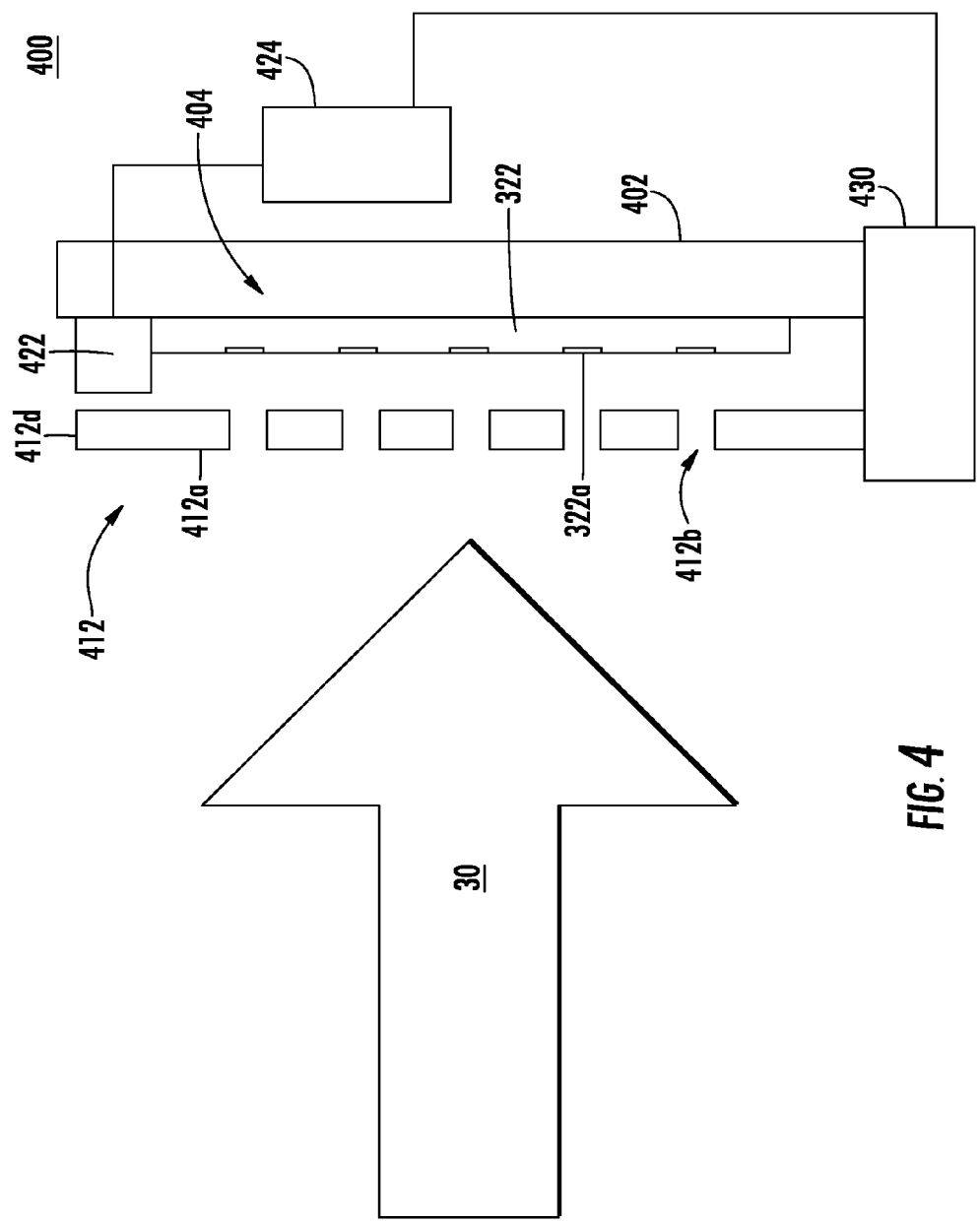
FIG. 4 illustrates an exemplary substrate alignment system according to one embodiment of the present disclosure.

Referring to FIG. 4, there is shown an exemplary the alignment system 400 for processing a substrate according to one embodiment of the present disclosure. The alignment system 400 of the present embodiment may be incorporated into the system 300 shown in FIG. 3.

The alignment system 400 may comprise a substrate support 402 on which the substrate 322 may be supported. In the present embodiment, the substrate support 402 may be a platen supporting one or more substrates. In other embodiments, the substrate support may be a conveyor belt or a carrier supporting one or more substrates 322 or one or more platens. If desired, the substrate support 402 may have a specific region 404 on which the substrate 322 is fixedly mounted, mechanically or electrostatically. In addition to supporting the substrate 322, the substrate support 402 may also control, for example, the temperature of the substrate 322 during ion implantation. For example, the substrate support 402 may be cooled directly to prevent excess heating of the substrate 322.

In another example, the substrate support 402 may be cooled or heated during the ion implantation to a desired temperature to provide hot or cold ion implantation. To provide cold ion implantation, the substrate support 402 may maintain the substrate at a temperature less than the room temperature, preferably less than 273° K. To provide hot ion implantation, the substrate support 402 may maintain the substrate at a temperature above the room temperature, preferably greater than 293° K.

The alignment system 400 of the present embodiment may also comprise a mask 412 disposed between the ion source 302 and the substrate 322. In the present disclosure, the mask 412 may be made of, for example, silicon, graphite, SiC, SiN, or any other material capable of withstanding harsh condition of ion implantation. The mask 412 may comprise a finger 412a and one or more apertures 412b. The finger 412a may be a portion of the mask 412 that blocks and prevents ions 30 from passing through traveling beyond the mask 412. The finger may be a single, continuous piece, or, alternatively, a plurality of separate and independent finger pieces. The ions 30, meanwhile, may pass through the aperture 412b and be implanted into regions of the substrate 322 to form the doped regions 322a. In the present disclosure, the aperture 412b may be a slot, hole, line, or other shaped aperture known to those skilled in the art.

Downstream of the mask 412, there may be a detector 422. The detector 422, in one embodiment, may be a Faraday probe. In other embodiments, the detector 422 may be time-of-flight ion sensor or mass spectrometer or any other type of detector capable of detecting, measuring, and/or analyzing particles, charged or neutral. Preferably, the detector 422 and the substrate 322 may be fixedly positioned with one another. Although FIG. 4 illustrates a detector 422 in contact with the substrate 322, those of ordinary skill in the art will recognize that detector 422 may also be spaced apart from the substrate 322. Further, the detector 422 may preferably be disposed on the substrate support 402. However, the detector 422 being disposed on other locations, on other components is not precluded.

In the present embodiment, the detector 422 may be substantially aligned with the finger 412a of the mask 412, when the mask 412 and the substrate 322 are properly aligned. As a result, the detector 422 may be substantially removed from the line-of-sight of the ions 30 directed to the substrate 322. If desired, the detector 422 may be proximate to an edge 412d of the finger 412a or mask 412, as illustrated in FIG. 4. In other embodiments, the detector 422 may be located at other positions, partially or substantially aligned with the aperture 412b and in a line-of-sight of the ions 30 when the mask 412 and the substrate 322 are properly aligned.

The movement of the mask 412 and the substrate 322 may be provided by a motion control system 430. In the present disclosure, the motion control system 430 may be one or more components capable of adjusting (e.g. translating, tilting, rotating, or otherwise moving) the position of the substrate 322, the mask 412, or both. By adjusting the position of the substrate 322, the mask 412, or both, desired alignment and/or orientation with respect to one another and/or with respect to the ions 30 may be achieved. For example, the motion control system 430 may be a roplat or a servo motor capable of adjusting the position of the substrate 322 to orient the substrate 322 at substantially perpendicular to the ions or ion beam 30. Such an orientation may enable the ions 30 to be implanted at 0° or substantially 0° incident or implant angle. If desired, the motion control system 430 may adjust the position of the substrate 322 to achieve non-zero incident or implant angle. Once achieved, the angle may remain constant during the entire ion implantation process or, alternatively, varied. The motion control system 430 may also translate the substrate 322, at a desired rate, vertically and/or horizontally so as to control the ion dose by which the substrate 322 is implanted. The rate of translation in one or more directions may be constant or varied.

The motion control system 430 may also control the position of the mask 412 jointly with the substrate 322 or independently of the substrate 322. By adjusting the position, the mask 412 may be parallel with respect to the substrate 322. As such, the mask 412, if desired, may also be perpendicular with respect to the ions or ion beam 30, and the ions may have 0° incident angle with respect to the mask 412.

A controller 424 may be coupled to the detector 412 and the motion control system 430. Based on the alignment analysis obtained using the detector 422, the controller 424 may provide an information regarding the alignment of the mask 412, the substrate 322, and/or the ions 30. If desired, the controller 424 may also provide a notification to a user or an instruction to correct the misalignment. The correction may be achieved by adjusting the position of the mask 412 and/or the substrate 322.

In operation, the ions 30 may be directed toward the substrate 322 along an ion beam path. A portion of the ions 30 may pass through the aperture 412b to form doped regions 322a. Meanwhile, another portion of the ions 30 aligned with the finger 412a may be blocked and prevented from traveling further downstream. Based on the alignment of the mask 412 and the substrate 322, thus the detector 422, the ions 30 may be detected by the detector 422. In the present embodiment, the detector 422 may be positioned behind the finger 412a and substantially removed from the line-of-sight of the ions 30, if the mask 412 and the substrate 322 are properly aligned. If aligned, the detector 422 will unlikely to be exposed to the ions 30 passing through the aperture 412b, or minimally exposed. The detector 422, therefore, will likely to detect no or minimal amount of ions 30. Upon misalignment, however, the detector 422 may be exposed to and will likely to detect more ions 30. As such, greater amount of ions 30 detected by the detector 422 may indicate that the mask 412, the substrate 322, and/or the ions 30 are misaligned. A change in the amount of ions 30 detected by the detector 422 may indicate that the mask 412, the substrate 322, and/or the ions 30 are in misalignment or the alignment has been changed.

Based on the amount of the ions 30 detected or change thereof, the controller 424 may provide an alert to check the alignment of the mask 412, the substrate 322, and/or the ions 30. If necessary, the controller 424 may also provide an instruction to the motion control system 430 to take necessary steps to correct the misalignment. This correction may involve adjusting the position of at least one of the mask 412 and the substrate 322 to proper alignment and/or orientation. In addition, the controller 424 may also provide alert or an instruction to interrupt the ion implantation process until additional or other corrective remedies are taken.

Figure 5A:
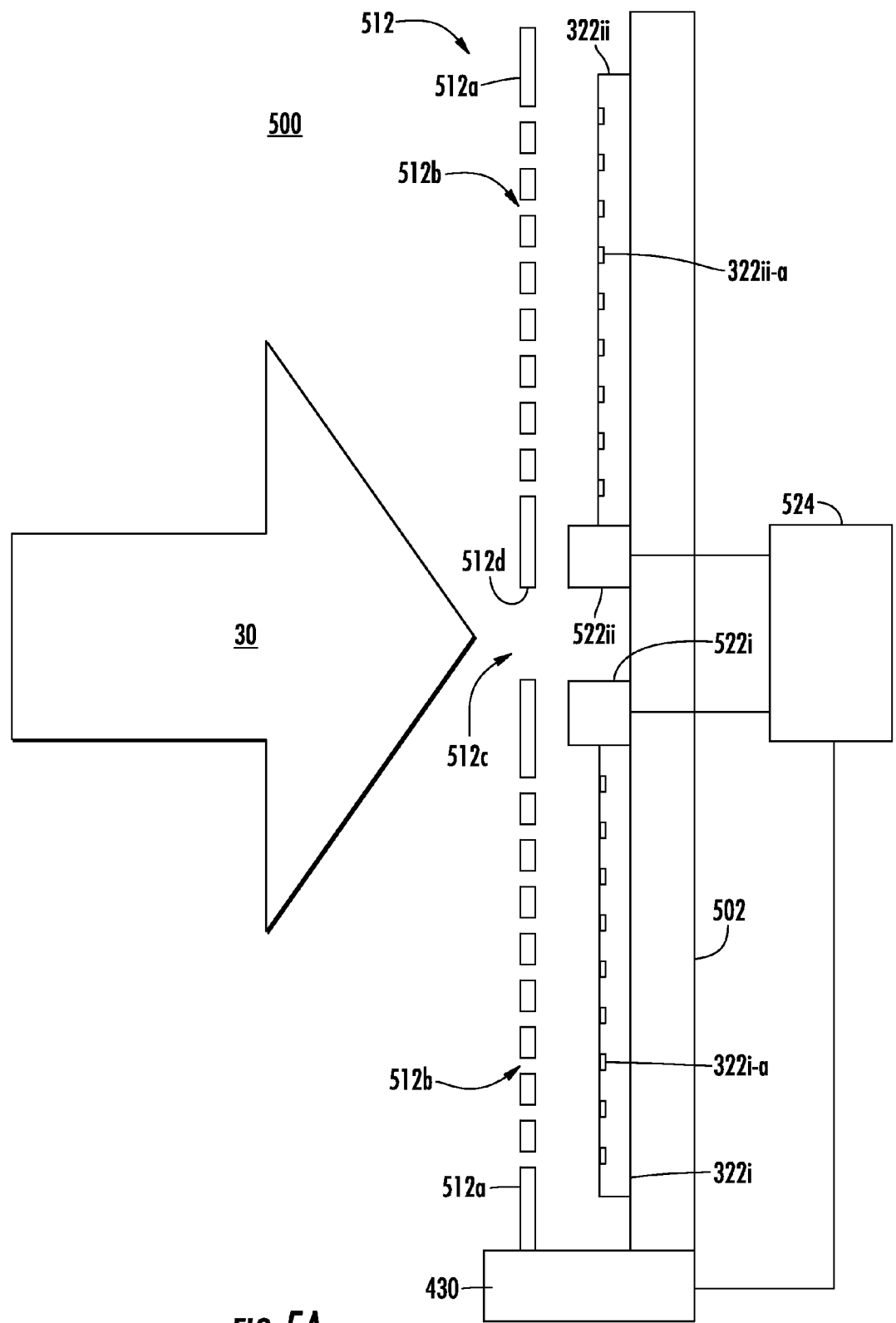
FIG. 5A and 5B illustrate another exemplary substrate alignment system according to another embodiment of the present disclosure.
Figure 5B:
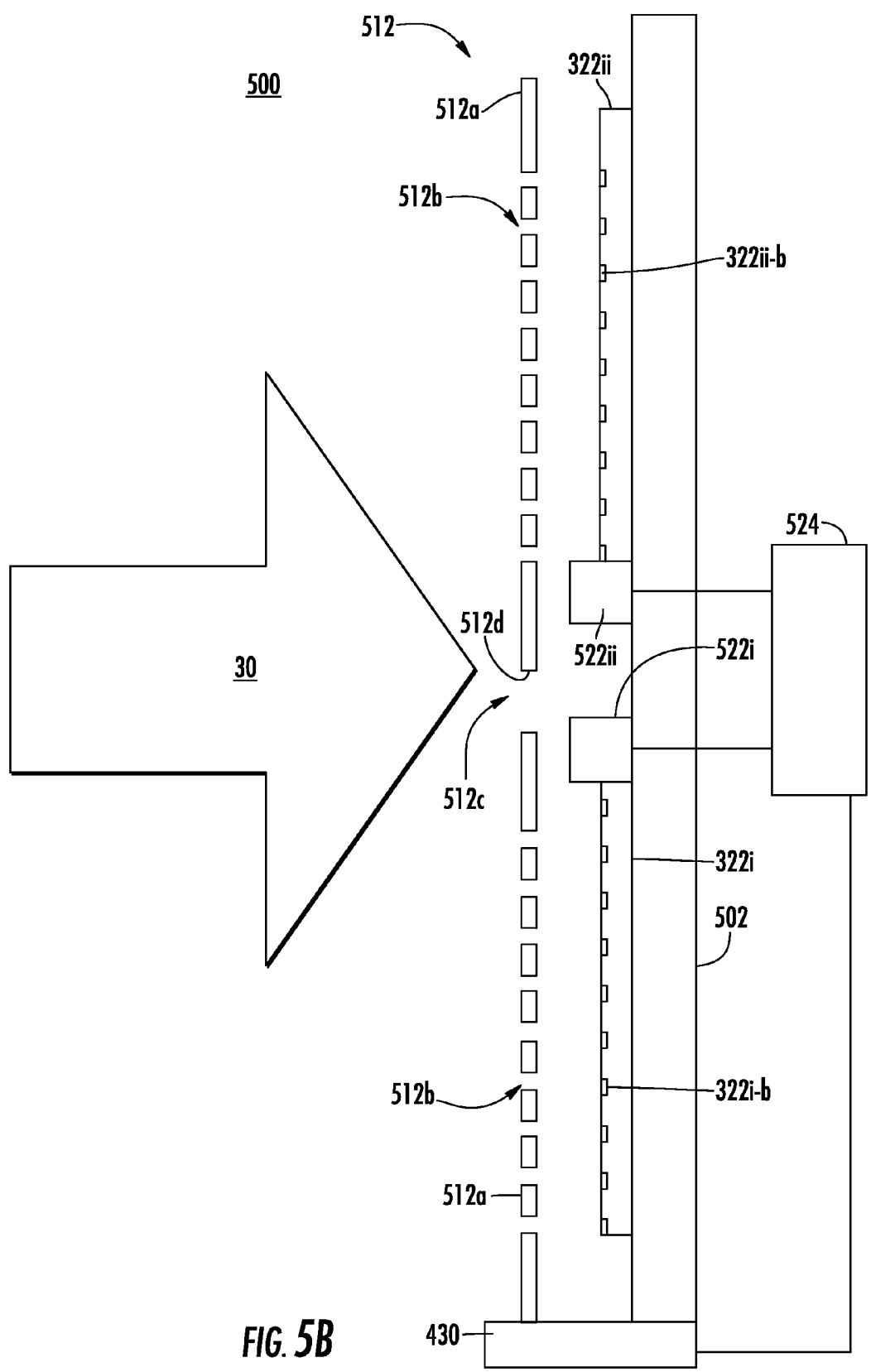

Referring to FIG. 5A and 5B, there is shown another exemplary alignment system 500 for processing a substrate according to another embodiment of the present disclosure.

The alignment system 500 of the present embodiment may be incorporated into the system 300 shown in FIG. 3. In the present embodiment, the alignment system 500 may be used in processing two or more substrates 322i and 322ii, and form uniform and aligned doped regions 322i-a and 322ii-a in two or more substrates 322i and 322ii. Those of ordinary skill in the art will recognize that many components included in the alignment system 500 of the present embodiment may be similar to those described in earlier embodiment. A detailed description of similar components may be omitted for the purposes of clarity and simplicity.

The alignment system 500 of the present embodiment comprises a substrate support 502 on which a plurality of substrates 322i and 322ii may be supported. Other than the fact that it is capable of supporting a plurality of the substrates 322i and 322ii, the substrate support 502 may be similar to that described in earlier.

The alignment system 500 may also comprise a mask 512 that may provide selective ion implantation. The mask 512 may comprise a finger 512a which blocks and prevents the ions 30 from passing through and traveling further downstream. The mask 512 may also comprise an aperture 512b through which a portion of the ions 30 may pass through. The mask 512 may also comprise at least one measurement apertures 512c. In the present embodiment, the measurement aperture 512c may be positioned near the center of the mask 512. However, the present disclosure does not preclude the measurement aperture 512c being located at other positions. Although the present figure illustrates the measurement aperture 512c as being larger than other apertures 512b, it is also possible for the measurement aperture 512d to be the same size as the other apertures 512b or even smaller than the other apertures 512b.

Downstream of the mask 512, there may be one or more detectors 522i and 522ii. In the present embodiment, there may be two detectors 522i and 522ii, each being fixedly positioned relative to the substrates 322i and 322ii. Similar to the detector of earlier embodiment, the detectors 522i and 522ii in the present embodiment may be Faraday probe or any other detector capable of detecting particles, charged or neutral. Each detector 522i and 522ii may be substantially positioned behind the finger 512a when the mask 512 is properly aligned with the substrate 322. As such, the each detector 522i and 522ii may be substantially removed from the line-of-sight of the ions 30 passing through the apertures 512b. If desired, each of the detectors 522i and 522ii may be proximate to an edge or interface 512d of the finger 512a and the measurement aperture 512c. However, fixedly positioning at least one of the detectors 522i and 522ii behind the aperture 512b is not precluded in the present disclosure.

The alignment system 500 of the present embodiment may also include a controller 524 which is coupled to the first and second detectors 522i and 522ii. Further, the alignment system 500 may also comprise a motion control system 430 that may control the orientation or position of the mask 512 and the substrate 322 with respect to one another and with respect to the ions or ion beam 30.

Upon proper alignment, the detectors 522i and 522ii will unlikely to be exposed to the ions 30 passing through the aperture 512b, or minimally exposed to the ions 30. As such, the detectors 522i and 522ii will detect no or minimal amount of ions 30. Upon misalignment, at least one of the detectors 522i and 522ii may detect a large amount of ions 30. In some embodiments, one of the detectors 522i and 522ii may detect more ions 30 than the other, as shown in FIG. 5B. As such, misalignment may lead to formation of non-uniform and misaligned doped regions 322i-b and 322ii-b as shown in FIG. 5B.

Based on the ions 30 detected by one or more of the detectors 522i and 522ii, or based on the difference in the amount of the ions 30 detected by the detectors 522i and 522ii, the alignment of the substrate 322i and 322ii and the mask 512 may be determined. In addition, the direction of the misalignment may be determined. For example, greater amount of ions detected by the first detector 522i may indicate that the mask 512 is misaligned toward the first substrate 322i, as shown in FIG. 5B. Conversely, greater amount of ions detected by the second detector 522ii may indicate that the mask 512 is misaligned toward the second substrate 322ii. Further, change in the amount of the ions 30 detected by one of the detectors 522i and 522ii or both may be indicative of the change in the alignment.

After detecting misalignment, the controller 524 may provide an alert to check the alignment of the mask 512, the substrate 322, and/or the ions 30. If necessary, the controller 524 may provide an instruction to the motion control system 430 to take necessary steps to correct the misalignment. This correction may involve repositioning at least one of the mask 512 and the substrate 322. In addition, the controller 524 may also provide alert or an instruction to interrupt the ion implantation process until additional or other corrective remedies are taken.

Figure 6:
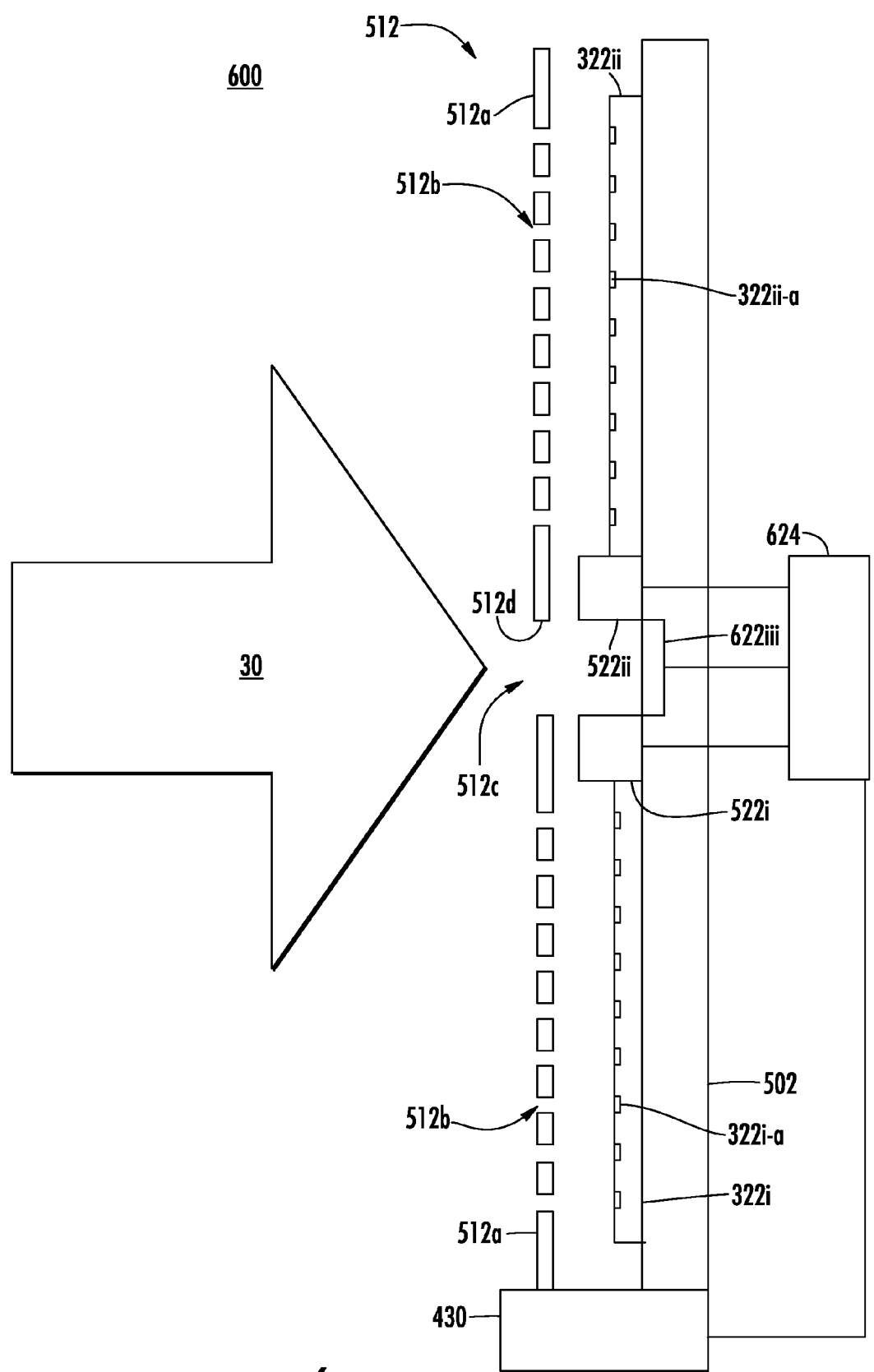
FIG. 6 illustrates another exemplary substrate alignment system according to another embodiment of the present disclosure.

Referring to FIG. 6, there is shown another exemplary alignment system 600 for processing a substrate according to another embodiment of the present disclosure. The alignment system 600 of the present embodiment comprises components and features that are similar to those included in the alignment system 500 shown in FIG. 5A and 5B. A detailed description of similar components and features may be omitted for the purposes of clarity and simplicity.

In the present embodiment, the alignment system 600 may also include a third detector 622iii. The third detector 622iii may be coupled to a controller 624 along with the first and second detectors 522i and 522ii. The third detector 622iii may be fixedly positioned with at least one of the substrates 322i and 322ii. Similar to the first and second detectors 522i and 522ii, the third detector 622iii may be Faraday probe or any other detector capable of detecting particles, charged or neutral. Relative to the mask 512, the third detector 622iii may be positioned behind the measurement apertures 512c. As such, the third detector 622iii may be in a line-of-sight of the ions 30 passing through the measurement apertures 512c. However, fixedly positioning the third detector 622iii behind one of the fingers 512a is not precluded in the present disclosure.

Upon proper alignment, the third detector 622iii may detect a large amount of ions 30. Meanwhile, the first and second detectors 522i and 522ii may not detect ions 30 or may detect minimal amount of ions 30. Accordingly, detection of a large amount of ions 30 by the third detector 622iii, but smaller amount of ions 30 detected by the first and second detectors 522i and 522ii may indicate proper alignment of the mask 512, the substrates 322i and 322ii, and/or the ions 30. Upon misalignment, however, the amount of ions detected by the first, second and third detectors 522i, 522ii, and 622iii may change. For example, the amount of ions detected by one of first and second detectors 522i and 522ii, or both, may be higher. Meanwhile, the amount of ions detected by the third detector 622iii may be less. If desired, angular misalignment of the mask 512 and the substrates 322i and 322ii may be determined by the ions 30 detected by the first, second and third detectors 5221, 522ii, and 622iii. For example, difference in the amount of ions 30 detected by the first and second detector 522i and 522ii, along with a change in the amount of ions 30 detected by the third detector 622iii may also indicate that there is an angular misalignment between the mask 512 and the substrates 322i and 322ii.

If misalignment is detected, the controller 624 may provide an alert to check the alignment of the mask 512, the substrate 322, and/or the ions 30. If necessary, the controller 624 may provide an instruction to the motion control system 430 to take necessary steps to correct the misalignment. This correction may involve repositioning at least one of the mask 512 and the substrate 322. In addition, the controller 624 may also provide alert or an instruction to interrupt the ion implantation process until additional or other corrective remedies are taken.

Figure 7:
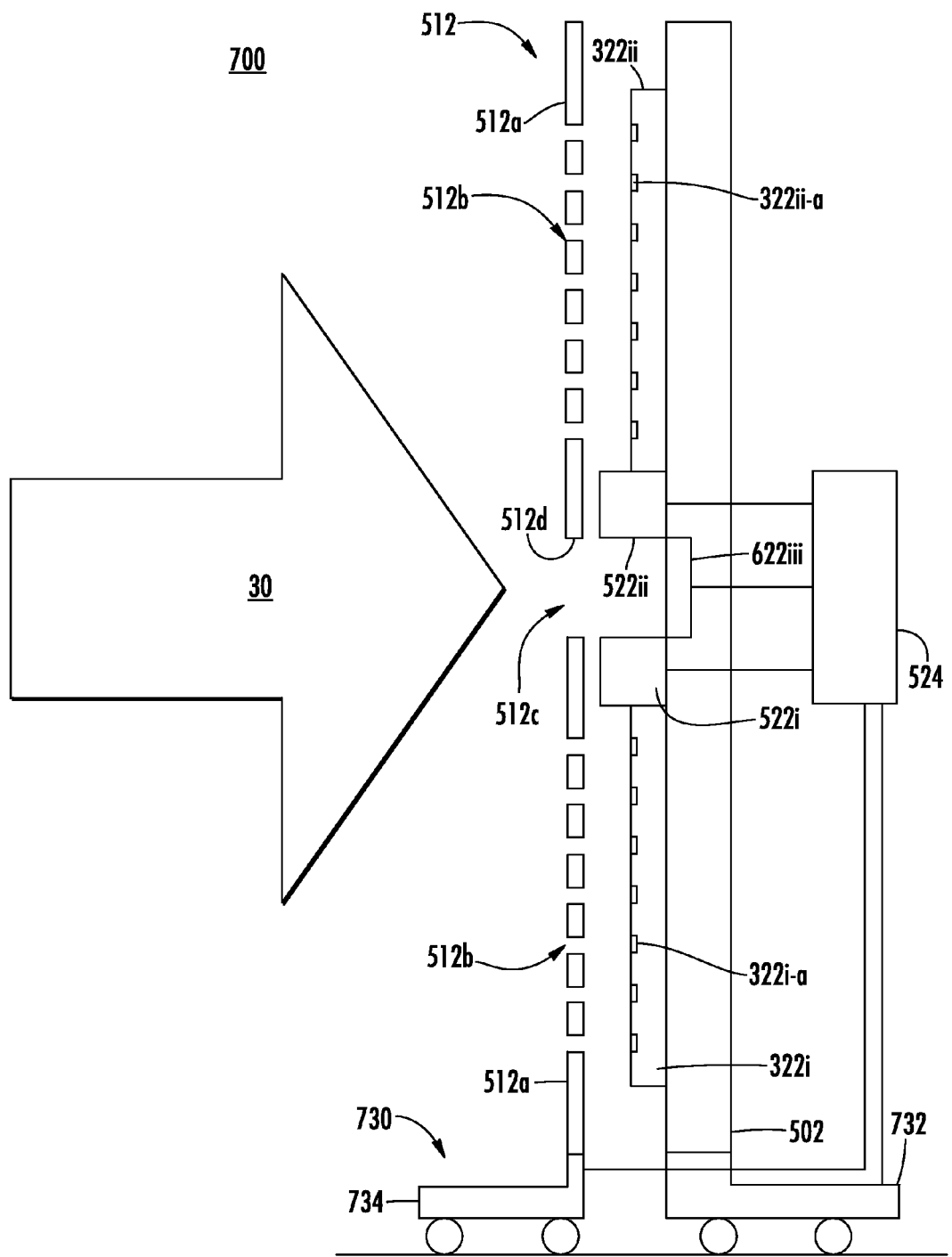
FIG. 7 illustrates another exemplary substrate alignment system according to another embodiment of the present disclosure.

Referring to FIG. 7, there is shown another exemplary alignment system 700 for processing a substrate according to another embodiment of the present disclosure. In the present embodiment, the alignment system 700 may be similar to those described earlier with FIGS. 5 and 6.

The alignment system 700 of the present embodiment may include a motion control system 730. The motion control system 730 may comprise first and second rails 732 and 734 capable of, among other, controlling the distance between the mask 512 and the substrates 322i and 322ii. In addition to controlling the distance between the mask 512 and the substrates 322i and 322ii, the motion control system 730 may include additional components capable of orienting or positioning the mask 512 and the substrates 322i and 322ii in a desired orientation or position.

In the present disclosure, several embodiments of an alignment system to provide aligned implant regions are provided. The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for processing one or more substrates, the system comprising:
    an ion source for generating ions of desired species, the ions generated from the ion source being directed toward the one or more substrates along an ion beam path;
    a substrate support for supporting the one or more substrates;
    a mask disposed between the ion source and the substrate support, the mask comprising fingers defining one or more apertures through which a portion of the ions traveling along the ion beam path pass and implanted into the one or more substrates; and
    a first detector for detecting ions, the first detector being fixedly positioned relative to the one or more substrates,
    wherein the mask and the first detector are positioned relative to one another such that the first detector is directly behind one of the fingers of the mask and removed from a line-of-sight of the ions by the one of the fingers of the mask if the mask and the one or more substrates are aligned, wherein the one of the fingers directly in front of the first detector blocks and prevents the ions from impinging on the first detector if the mask and the one or more substrates are aligned.

2. The system according to claim 1, wherein the first detector is disposed on the substrate support.

3. The system according to claim 1, further comprising a second detector for detecting ions, the second detector being fixedly positioned relative to the one or more substrates.

4. The system according to claim 3, wherein the second detector is disposed on the substrate support.

5. The system according to claim 3, further comprising: a motion control system configured to adjust position of at least one of the mask and the one or more substrates relative to one another.

6. The system according to claim 5, further comprising: a controller coupled to the first detector and the motion control system, wherein the controller is configured to provide an instruction to the motion control system to adjust the position of the at least one of the mask and the one or more substrates relative to one another.

7. The system according to claim 5, wherein the motion control system is configured to adjust the position of at least one of the mask and the one or more substrates relative to one another if the first detector detects ions.

8. The system according to claim 5, wherein the motion control system is configured to adjust the position of at least one of the mask and the one or more substrates relative to one another if amount of ions detected by the first detector changes.

9. The system according to claim 5, wherein the motion control system is configured to adjust the position of at least one of the mask and the one or more substrates relative to one another if amount of ions detected by the first detector is different from the amount of ions detected by the second detector.

10. The system according to claim 1, further comprising: a second detector for detecting ions, the second detector being fixedly positioned relative to the one or more substrates, wherein the second detector is positioned behind the one or more aperture and in a direct line-of-sight of the ions if the mask and the one or more substrates are properly aligned.

11. The system according to claim 1, further comprising: a second detector for detecting ions, the second detector being fixedly positioned relative to the one or more substrates, wherein the second detector is positioned behind the finger and removed from a direct line-of-sight of the ions if the mask and the one or more substrates are properly aligned.

* * * * *